(12) United States Patent
Jeon

(10) Patent No.: US 7,851,290 B2
(45) Date of Patent: Dec. 14, 2010

(54) METHOD OF FABRICATING SEMICONDUCTOR DEVICE

(75) Inventor: Yoo Nam Jeon, Seongnam-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/399,271

(22) Filed: Mar. 6, 2009

(65) Prior Publication Data

US 2009/0227080 A1  Sep. 10, 2009

(30) Foreign Application Priority Data

Mar. 10, 2008  (KR)  ............... 10-2008-0021950

(51) Int. Cl.
| | |
|---|---|
| H01L 21/8238 | (2006.01) |
| H01L 21/336 | (2006.01) |
| H01L 21/20 | (2006.01) |
| H01L 21/3205 | (2006.01) |
| H01L 21/4763 | (2006.01) |

(52) U.S. Cl. ............... 438/199; 438/257; 438/586; 438/584

(58) Field of Classification Search ......... 438/257, 438/199, 586, 588, 587, 584, 533, 233
See application file for complete search history.

(56) References Cited

U.S. PATENT DOCUMENTS 7,439,157 B2 * 10/2008 Bian et al. ............... 438/435

2009/0218639 A1 * 9/2009 Beyer et al. ............. 257/410

FOREIGN PATENT DOCUMENTS

| KR | 10-2005-0010260 | 1/2005 |
|---|---|---|
| KR | 10-2008-0000900 | 1/2008 |

* cited by examiner

*Primary Examiner*—Chuong A. Luu
(74) *Attorney, Agent, or Firm*—Marshall, Gerstein & Borun LLP

(57) ABSTRACT

A method of fabricating a semiconductor device, in which although a metal layer is included in a gate pattern, the gap-fill characteristic of contact plugs coupled to junctions can be improved and degradation in the data retention characteristic can also be prevented. According to the method, a semiconductor substrate in which lower gate patterns and gate hard mask patterns are sequentially stacked is first provided. Junctions are formed in the semiconductor substrate on both sides of each of the lower gate patterns. A first pre-metal dielectric layer is formed over the semiconductor substrate in which the hard mask patterns and the junctions are formed. Contact holes through which the junctions are exposed are formed in the first pre-metal dielectric layer. Gate trenches through which the lower gate patterns are exposed are formed by removing the hard mask patterns. Upper gate patterns, each including a metal layer, are formed in the gate trenches, and first contact plugs are formed in the contact holes.

13 Claims, 3 Drawing Sheets

METHOD OF FABRICATING SEMICONDUCTOR DEVICE

CROSS-REFERENCE TO RELATED APPLICATION

Priority to Korean patent application number 10-2008-0021950 filed Mar. 10, 2008, the entire disclosure of which is incorporated herein by reference in is claimed.

BACKGROUND OF THE INVENTION

The invention relates generally to a method of fabricating a semiconductor device and, more particularly, to a method of fabricating a semiconductor device, in which although a metal layer is included in a gate pattern, the gap-fill characteristic of contact plugs coupled to junctions can be improved and degradation in the data retention characteristic can also be prevented.

As the degree of integration of semiconductor devices increases, there is a tendency to miniaturize various patterns constituting the semiconductor devices. Such miniaturization of the patterns causes an increase in the resistance value of conductive patterns included in the semiconductor devices, which limits the degree of integration attainable for the devices. To overcome this limitation, a method of utilizing a metal layer of low resistivity, such as tungsten (W), as the conductive pattern has recently been introduced.

In the case in which a metal layer is used as the gate pattern of a NAND flash memory device in which a gate insulating layer, a floating gate electrode, a dielectric layer, and a control gate electrode are sequentially stacked, the metal layer is formed on a polysilicon layer for a control gate electrode. Thus, the control gate electrode comprises a stack structure of a polysilicon layer and a metal layer. To form the gate patterns of this structure, first, a dielectric layer, a polysilicon layer for a control gate electrode, and a conductive layer are sequentially formed over a semiconductor substrate in which a gate insulating layer, a polysilicon layer for a floating gate electrode, and an isolation layer are formed. The conductive layer, the polysilicon layer for the control gate electrode, the dielectric layer, and the polysilicon layer for the floating gate electrode are then etched to form gate patterns. At this time, the sidewalls of the gate patterns are damaged by the etching process, so a re-oxidization process for removing the damaged portions must be performed so as to prevent degradation of data retention characteristics of the semiconductor devices. However, there is a possibility that failure of the semiconductor device may occur, since the conductive layer expands abruptly due to heat used for the re-oxidization process and is abnormally oxidized. If the conductive layer is used, the re-oxidization process is difficult to perform. As a scheme for solving this problem, there has been proposed a selective oxidization process of oxidizing only the sidewalls of the polysilicon layer. However, although the selective oxidization process has been introduced, the data retention characteristic degradation problem of the semiconductor device remains unsolved.

Meanwhile, after the gate patterns are formed, junctions are formed in the semiconductor substrate on both sides of each of the gate patterns, and a pre-metal dielectric layer is formed over the semiconductor substrate including the gate patterns and the junctions. Next, contact holes through which the junctions are exposed are formed in such a way as to penetrate the pre-metal dielectric layer. The insides of the contact holes are gap filled with conductive material, thus forming contact plugs. Metal wiring lines electrically connected to the junctions through the contact plugs are formed on the pre-metal dielectric layer. In this case, the contact plugs can be stably formed only when no voids remain therein in the process of gap-filling the contact holes with the conductive material. In order to easily gap-fill the contact holes with the conductive material without the occurrence of voids, the aspect ratio of the contact hole must be low. However, the width of the contact hole decreases due to the high degree of integration. Moreover, if the conductive layer is used, the aspect ratio of the contact hole increases significantly since the height of the contact hole increases up to the height (i.e., thickness) of the conductive layer. Consequently, a problem arises because the contact holes are not fully gap-filled with the contact plugs.

BRIEF SUMMARY OF THE INVENTION

The invention is directed toward a method of fabricating a semiconductor device, in which although a metal layer is included in a gate pattern, the gap-fill characteristic of contact plugs coupled to junctions can be improved and degradation in data retention characteristics can also be prevented.

In accordance with a method of fabricating a semiconductor device according to the invention, a semiconductor substrate in which lower gate patterns and gate hard mask patterns are sequentially stacked is first provided. Junctions are formed in the semiconductor substrate on both sides of each of the lower gate patterns. A first pre-metal dielectric layer is formed over the semiconductor substrate in which the hard mask patterns and the junctions are formed. Contact holes through which the junctions are exposed are formed in the first pre-metal dielectric layer. Gate trenches through which the lower gate patterns are exposed are formed by removing the hard mask patterns. Upper gate patterns, each including a metal layer, are formed in the gate trenches, and first contact plugs are formed in the contact holes.

After the junctions are formed in the semiconductor substrate on both sides of each of the lower gate patterns, a self-aligned contact (SAC) is preferably further formed on the entire surface of the semiconductor substrate, including the junctions.

The upper gate patterns and the first contact plugs are preferably formed at the same time.

Each of the lower gate patterns preferably includes a gate insulating layer, a conductive layer for a floating gate, a dielectric layer, and a polysilicon layer for a control gate, which are preferably sequentially formed.

The junctions preferably include drains formed in a drain select transistor area of NAND flash memory and sources formed in a source select transistor area of the NAND flash memory.

The contact holes preferably include drain contact holes through which a drain is exposed and source contact holes through which a source is exposed, and the contact plugs preferably include first drain contact plugs formed in the drain contact holes and source select lines formed in the source contact holes.

Further, a second pre-metal dielectric layer is preferably formed on the first pre-metal dielectric layer in which the first drain contact plugs and the source select lines are formed, second contact plugs connected to the first drain contact plugs are preferably formed in the second pre-metal dielectric layer, and bit lines connected to the second contact plugs are preferably formed.

After the semiconductor substrate in which the lower gate patterns and the gate hard mask patterns are sequentially stacked is provided, a re-oxidization process for removing damages on sidewalls of the lower gate patterns is preferably performed.

After the junctions are formed in the semiconductor substrate on both sides of each of the lower gate patterns, spacers are preferably formed on sidewalls of the lower gate patterns and the hard mask patterns.

The spacers preferably comprise oxide materials.

The hard mask patterns preferably comprise nitride materials, and the first pre-metal dielectric layer preferably comprises oxide materials.

Forming the upper gate patterns, each including the metal layer, in the gate trenches and forming the first contact plugs in the contact holes preferably comprises forming metallic material for gap-filling the gate trenches and the contact holes, and removing the metallic material formed on the first pre-metal dielectric layer in such a manner that the metallic material remains within the gate trenches and the contact holes.

The upper gate patterns and the contact plugs preferably comprise tungsten (W).

DESCRIPTION OF SPECIFIC EMBODIMENT

Figure 1A:
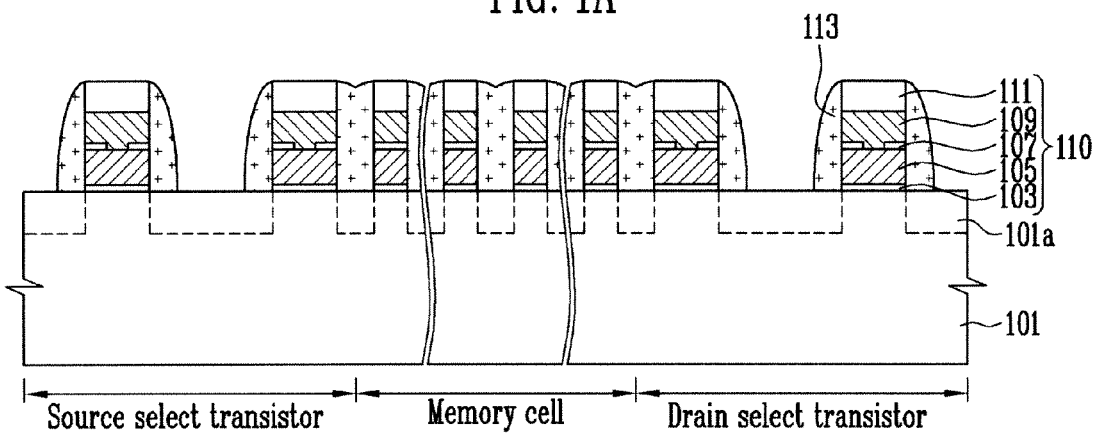
FIGS. 1A to 1F are sectional views sequentially showing a method of forming gate patterns of a semiconductor device in accordance with one embodiment of the invention.

The invention is described in detail in below in connection with a specific embodiment with reference to the accompanying drawings. The illustrated embodiment is provided to complete the disclosure of the invention and to allow those having ordinary skill in the art to understand the scope of the invention. When it is said that any part, such as a layer, film or area, is positioned on another part, it means the part is directly on the other part or above the other part with at least one intermediate part. To clarify multiple layers and regions, the thickness of the layers is enlarged in the drawings.

FIGS. 1A to 1F are sectional views sequentially showing a method of forming gate patterns of a semiconductor device in accordance with one embodiment of the invention. Hereinafter, FIGS. 1A to 1F illustrate a NAND flash memory device. A NAND flash memory device includes a number of strings. One string includes a plurality of memory cells, which are connected in series to each other, and select transistors connected to both terminals of the memory cell with a plurality of memory cells intervening therebetween. One of the select transistors is a drain select transistor, and the other of the select transistors is a source select transistor.

Referring to FIG. 1A, a dielectric layer 107 and a second polysilicon layer 109 are sequentially formed over a semiconductor substrate 101 in which a gate insulating layer 103 and a first polysilicon layer 105 are formed. A gate hard mask pattern 111 is formed on the second polysilicon layer 109. Here, the gate insulating layer 103 and the first polysilicon layer 105 are patterned in a line fashion. The gate hard mask pattern 111 is preferably formed from a nitride layer and defines areas where lower gate patterns 110 will be formed. The second polysilicon layer 109 is exposed between the gate hard mask patterns 111, and the underlying dielectric layer 107 and first polysilicon layer 105 are etched. At this time, the gate insulating layer 103 can be further etched. The gate insulating layer 103 and the first polysilicon layer 105, formed to have the line fashion by the gate hard mask pattern 111, are separated into a number of independent patterns. The dielectric layer 107 and the second polysilicon layer 109 are formed in a line fashion in a direction crossing the gate insulating layer 103 and the first polysilicon layer 105, which were formed in the line fashion. Thus, the lower gate patterns 110, each including the gate insulating layer 103, the first polysilicon layer 105, the dielectric layer 107, and the second polysilicon layer 109, and the gate hard mask patterns 111 are sequentially stacked over the semiconductor substrate 101. A contact hole through which the first polysilicon layer 105 is exposed is formed in the dielectric layer 107 included in the lower gate pattern 110 of source and drain select transistor areas. The second polysilicon layer 109 is electrically connected to the first polysilicon layer 105 through the contact hole formed in the dielectric layer 107. This structure is identical to that of the lower gate pattern 110 of the source select transistor area.

Meanwhile, an isolation layer (not shown) is further formed in a direction crossing the first polysilicon layer 105 in an isolation area of the semiconductor substrate 101. This isolation layer (not shown) can be formed before the gate insulating layer 103 and the first polysilicon layer 105 are formed in the line fashion or after the gate insulating layer 103 and the first polysilicon layer 105 are patterned in the line fashion.

The first polysilicon layer 105 is a conductive layer for a floating gate of the memory cell.

The dielectric layer 107 preferably has an oxide/nitride/oxide (ONO) structure, including a first oxide layer, a nitride layer, and a second oxide layer.

The second polysilicon layer 109 is a conductive layer for a control gate.

In order to remove damage to the sidewalls of the lower gate patterns 110 occurring during the etching process, a re-oxidization process is performed. A metal layer, such as tungsten (W) with low resistivity, is not formed in the lower gate pattern 110 in accordance with the invention. Thus, although the re-oxidization process is performed, phenomena such as abnormal oxidization do not occur irrespective of the temperature. As described above, since a re-oxidization process can be performed irrespective of temperature, the invention can prevent degradation in the data retention characteristics of the device.

Subsequently, ions are implanted using the lower gate pattern 110 and the gate hard mask pattern 111 as a mask, thus forming junctions 101a in the semiconductor substrate 101a on both sides of the lower gate pattern 110.

A spacer layer is formed on the semiconductor substrate 101 including the lower gate pattern 110 and the gate hard mask pattern 111. The spacer layer is illustratively etched by an etch-back process, etc., thus forming spacers 113 on the sidewalls of the lower gate pattern 110 and the gate hard mask pattern 111. The spacers 113 are typically formed from oxide materials. In a memory cell area where a gap between the lower gate patterns 110 is relatively narrower than that of the drain select transistor area and the source select transistor area, the spacers 113 can fully gap-fill the space between the gate hard mask pattern 111 and the lower gate pattern 110. On the other hand, in the drain select transistor area and the source select transistor area where the gap between the lower gate patterns 110 is relatively wide, the spacers 113 are formed in such a way not to gap-fill the space between the gate hard mask pattern 111 and the lower gate pattern 110.

Figure 1B:
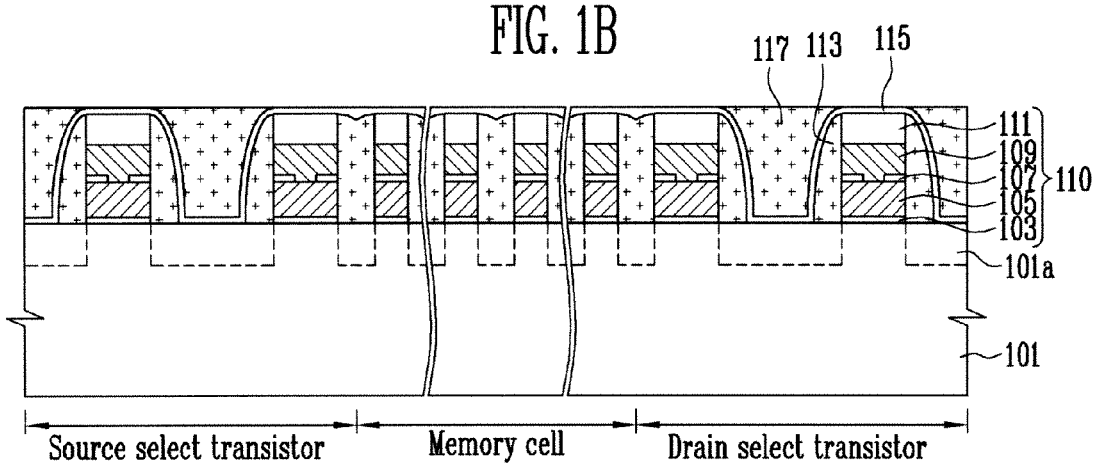

Referring to FIG. 1B, a self-aligned contact (hereinafter referred to as "SAC") nitride layer 115 is deposited on the entire surface of the semiconductor substrate 101, including the spacers 113 and the gate hard mask patterns 111. A first pre-metal dielectric layer 117 is deposited on the SAC nitride layer 115. The first pre-metal dielectric layer 117 is formed in such a way as to gap-fill the space between the spacers 113 and then polished by a chemical mechanical polishing (hereinafter referred to as "CMP") process, for example. The SAC nitride layer 115 functions as an etch-stop layer in a subsequent contact hole formation process. After the CMP process is completed, the SAC nitride layer 115 on the gate hard mask pattern 111 is exposed.

Figure 1C:
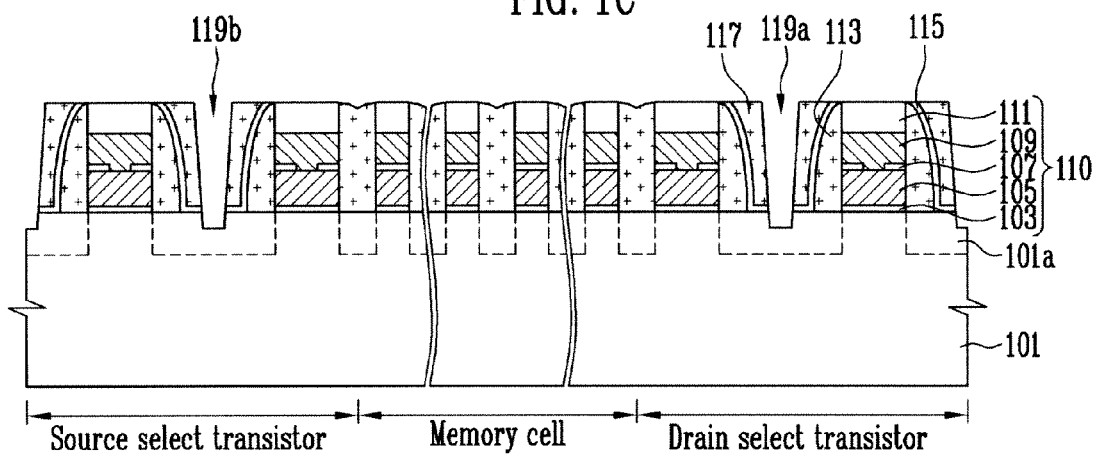

Referring to FIG. 1C, first drain contact holes 119a and source contact holes 119b through which the junctions 101a are exposed are formed in the first pre-metal dielectric layer 117.

The process of forming the first drain contact holes 119a and the source contact holes 119b is described in detail below. First, source/drain contact hard mask patterns are formed over the semiconductor substrate 101 in which the SAC nitride layer 115 and the first pre-metal dielectric layer 117 are formed. Here, the first pre-metal dielectric layer 117 is preferably formed from oxide materials.

The source/drain contact hard mask patterns define areas in which the first drain contact holes 119a and the source contact holes 119b will be formed. The first pre-metal dielectric layer 117 exposed between the source/drain contact hard mask patterns is etched by an etch process, so the first drain contact holes 119a and the source contact holes 119b are formed in the first pre-metal dielectric layer 117. The first drain contact hole 119a is formed in the drain select transistor area, and the junction area 101a exposed through the first drain contact hole 119a is a drain. The source contact holes 119b are formed in line form in the source select transistor area. Thus, a number of the junctions 101a are exposed in series by one source contact hole 119b, and the junctions 101a exposed through the source contact holes 119b are sources. The source/drain contact hard mask patterns are then removed. As described above, the first drain contact holes 119a and the source contact holes 119b in accordance with the invention are formed in the state where the metal layer is not formed between the gate hard mask pattern 111 and the second polysilicon layer 109 and, therefore, have a low height (i.e., thickness) as compared with the prior art. Accordingly, the first drain contact holes 119a and the source contact holes 119b can have a low aspect ratio as compared with the prior art.

Figure 1D:
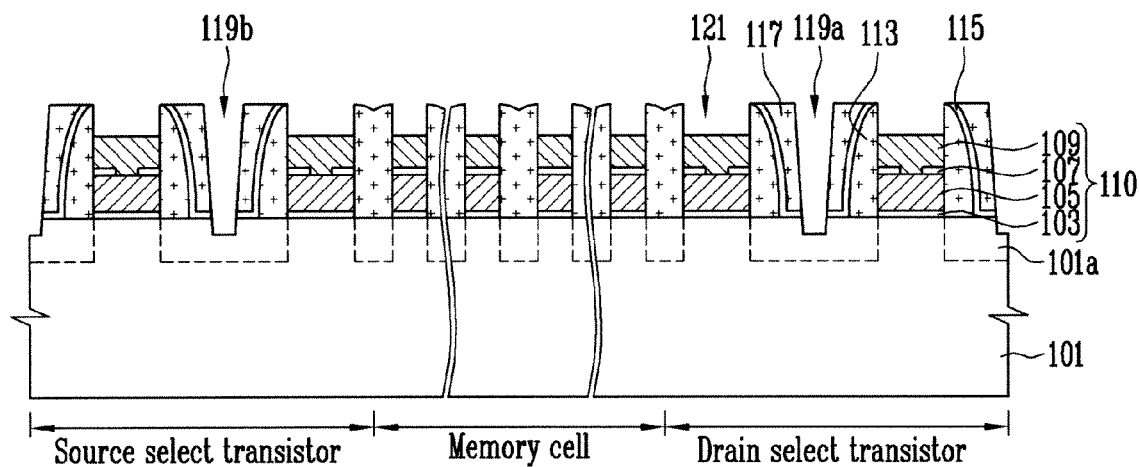

Referring to FIG. 1D, the SAC nitride layer 115 formed between the first drain contact holes 119a and between the source contact holes 119b, and the gate hard mask pattern 111 are removed. Here, the SAC nitride layer 115 and the gate hard mask pattern 111 are illustratively formed from nitride materials. Thus, the SAC nitride layer 115 and the gate hard mask patterns 111 are preferably etched using phosphoric acid that is able to selectively etch the nitride materials. Gate trenches 121 are formed in areas from which the gate hard mask patterns 111 are removed. The gate trenches 121 expose the second polysilicon layers 109 of the lower gate patterns 110 and define areas in which the metal layer will be formed.

Figure 1E:
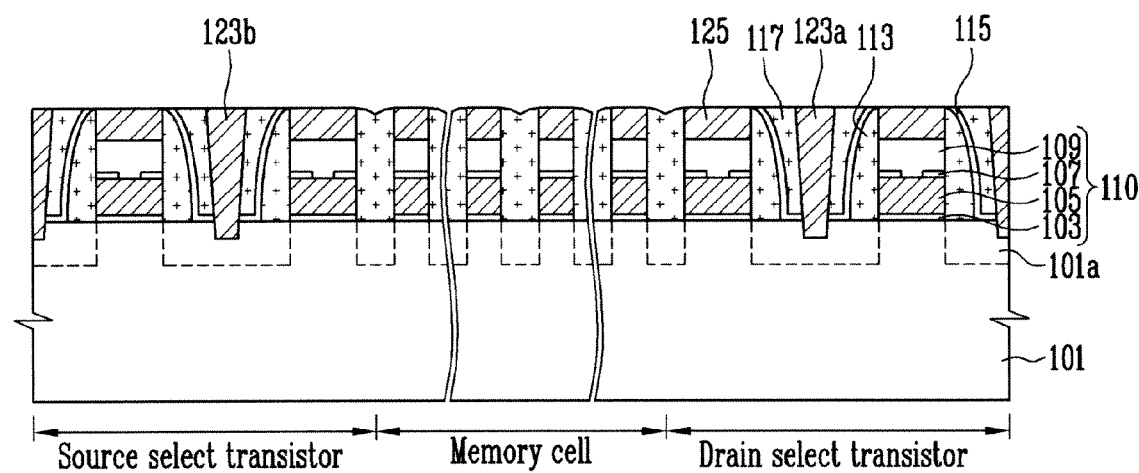

Referring to FIG. 1E, upper gate patterns 125 including the metal layer are formed within the gate trenches 121. Contact plugs 123a, 123b are formed within the contact holes 119.

The upper gate patterns 125 and the contact plugs 123a, 123b are formed by gap-filling the insides of the gate trenches 121 and the contact holes 119a, 119b with metallic material and then removing unnecessary metallic material, preferably using a CMP or an etch-back process so that the metallic material remains only within the gate trenches 121 and the contact holes 119a, 119b.Here, the metallic material is for low-resistance wiring lines and preferably comprises tungsten (W) with low resistivity.

As described above, the invention can form the upper gate patterns 125, including the metal layer, simultaneously with the contact plugs 123a, 123b. Thus, a complicated process for forming the upper gate patterns 125 is not necessary. Further, when forming the contact plugs 123a, 123b according to the invention, the insides of the contact holes 119a, 119b, which have a low aspect ratio as compared with the prior art, are gap-filled as described with reference to FIG. 1C. Accordingly, the gap-fill characteristic of the contact plugs 123a, 123b can be improved. In this case, the contact plugs formed in the drain select transistor area become first drain contact plugs 123a, and the contact plugs formed in the source select transistor area become source select lines 123b.When forming the upper gate patterns 125 and the contact plugs 123a, 123b, the entire surface of the semiconductor substrate 101, including the upper gate patterns 125 and the contact plugs 123a, 123b, is polished.

Figure 1F:
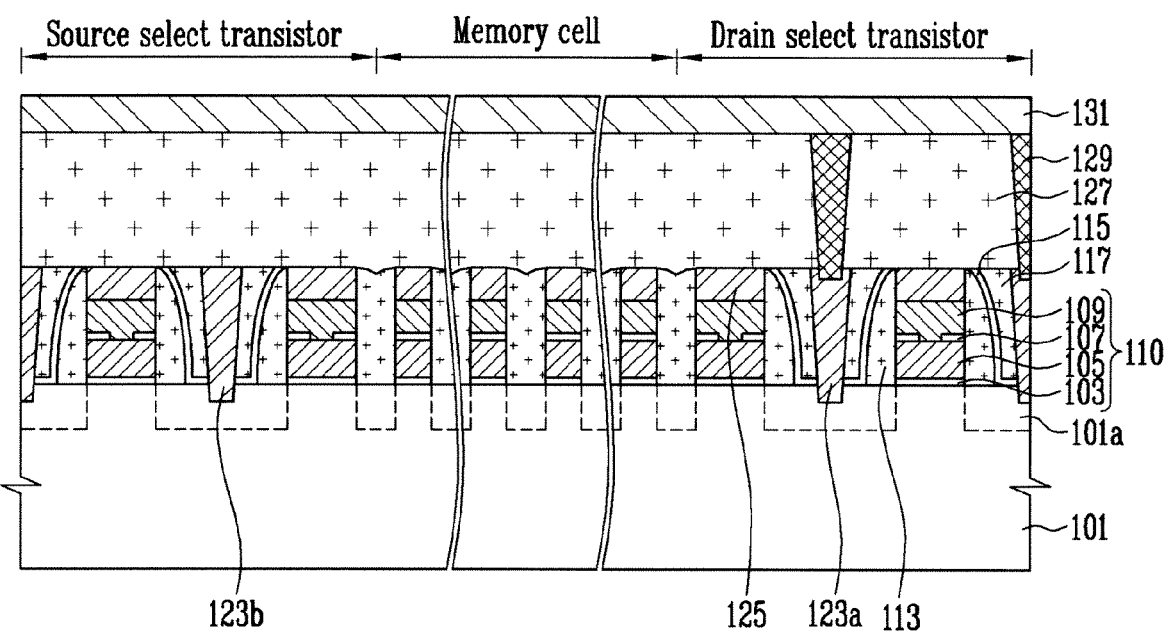

Referring to FIG. 1F, after the contact plugs 123 are formed, a subsequent process of forming an upper structure, including second drain contact plugs, bit lines 131, etc., is carried out.

In other words, after a second pre-metal dielectric layer 127 is formed over the semiconductor substrate 101 in which the contact plugs 123 are formed, second drain contact plugs 129 coupled to the first drain contact plugs 123a are formed in the second pre-metal dielectric layer 127. The bit lines 131 connected to the second drain contact plugs are then formed. As described above, if the drain contact plugs are separately formed by the formation process of the first drain contact plugs 123a and the formation process of the second drain contact plugs 129, the degree of gap-fill difficulty of the drain contact plugs can be lowered.

As described above, according to the invention, when the contact plugs are formed, the metal layer is formed. Accordingly, although the re-oxidization process of removing damage on the sidewalls of the gate patterns is preferably performed before the contact plugs are formed, the metal layer can be prevented from being abnormally oxidized.

A NAND flash memory device has been described as an example with reference to FIGS. 1A to 1F. However, the invention can be applied not only to NAND flash memory devices, but to a variety of semiconductor devices, such as DRAM, in which the metal layer is used as the gate patterns.

According to the invention, after layers other than a metal layer, among between layers included in a gate pattern, are deposited and then patterned, a trench defining an area where the metal layer will be formed is preferably formed at the highest layer of the gate pattern and the metal layer of the gate pattern is formed within the trench. Thus, before the metal layer is formed, a thermal process such as a re-oxidization process can be performed. Accordingly, the invention can improve the data retention characteristics of a semiconductor device. Further, the invention can improve the loading problem of a gate pattern since a metal layer can be included in the gate pattern.

Moreover, according to the invention, contact plugs connected to junctions can be formed simultaneously with a metal layer of a gate pattern. Thus, although the metal layer of the gate pattern is formed using a process different from that of layers of other gate patterns, the process is not complicated. Further, according to the invention, the aspect ratio of contact holes, which must be gap-filled when the contact holes are gap-filled with conductive material for forming the contact plugs, is reduced as much as the height of the metal layer of the gate pattern. Accordingly, the gap-fill characteristic of the contact plugs can be improved.

The embodiment disclosed herein has been proposed to allow a person skilled in the art to easily implement the invention, and the person skilled in the part may implement the invention in various ways. Therefore, the scope of the invention is not limited by or to the embodiment as described above, and should be construed to be defined only by the appended claims and their equivalents.

What is claimed is:

1. A method of fabricating a semiconductor device, the method comprising:
    providing a semiconductor substrate in which lower gate patterns and gate hard mask patterns are sequentially stacked, the lower gate patterns each having two sides;
    forming junctions in the semiconductor substrate on both sides of each of the lower gate patterns;
    forming a first pre-metal dielectric layer over the semiconductor substrate in which the gate hard mask patterns and the junctions are formed;
    polishing the first pre-metal dielectric layer to remove the first pre-metal dielectric layer formed over the gate hard mask patterns;
    forming contact holes in the firs pre-metal layer through which the junctions are exposed;
    removing the gate hard mask patterns to form gate trenches through which the lower gate patterns are exposed; and
    forming upper gate patterns, each including a metal layer, in the gate trenches and forming first contact plugs in the contact holes.

2. The method of claim 1, further comprising, after forming the junctions in the semiconductor substrate on both sides of each of the lower gate patterns, forming a self-aligned contact (SAC) on the entire surface of the semiconductor substrate, including the junctions.

3. The method of claim 1, comprising forming the upper gate patterns and the first contact plugs at the same time.

4. The method of claim 1, wherein each of the lower gate patterns comprises a gate insulating layer, a conductive layer for a floating gate, a dielectric layer, and a polysilicon layer for a control gate, the method comprising sequentially forming said layers of the lower gate patterns.

5. The method of claim 1, wherein the junctions comprise drain formed in a drain select transistor of a NAND flash memory and sources formed in a source select transistor of the NAND flash memory.

6. The method of claim 1, wherein:
    the contact holes comprise drain contact holes through which the drain is exposed and source contact holes through which the source is exposed, and
    the contact plugs comprise first drain contact plugs formed in the drain contact holes and source select lines formed in the source contact holes.

7. The method of claim 6, further comprising:
    forming a second pre-metal dielectric layer on the first pre-metal dielectric layer in which the first drain contact plugs and the source select lines are formed;
    forming second contact plugs connected to the first drain contact plugs in the second pre-metal dielectric layer; and
    forming bit lines connected to the second contact plugs.

8. The method of claim 1, comprising, after providing the semiconductor substrate in which the lower gate patterns and the gate hard mask patterns are sequentially stacked, performing a re-oxidization process to remove damage on sidewalls of the lower gate patterns.

9. The method of claim 1, comprising, after forming the junctions in the semiconductor substrate on both sides of each of the lower gate patterns, forming spacers on sidewalls of the lower gate patterns and the gate hard mask patterns.

10. The method of claim 9, wherein the spacers comprise oxide materials.

11. The method of claim 1, wherein:
    the gate hard mask patterns comprise nitride materials, and
    the first pre-metal dielectric layer comprises oxide materials.

12. The method of claim 1, wherein forming the upper gate patterns, each including the metal layer, in the gate trenches and forming the first contact plugs in the contact holes comprises:
    forming metallic material for gap-filling the gate trenches and the contact holes; and
    removing the metallic material formed on the first pre-metal dielectric layer in such a manner that the metallic material remains within the gate trenches and the contact holes.

13. The method of claim 1, wherein the upper gate patterns and the contact plugs comprise tungsten (W).

* * * * *